(12) United States Patent
Yasuda et al.

(10) Patent No.: US 7,337,547 B2
(45) Date of Patent: Mar. 4, 2008

(54) HIGH FREQUENCY SWITCHING CIRCUIT DEVICE

(75) Inventors: Eiji Yasuda, Takatsuki (JP); Kenichi Hidaka, Takatsuki (JP); Yasuyuki Masumoto, Otsu (JP); Tadayoshi Nakatsuka, Toyonaka (JP); Atsushi Watanabe, Kadoma (JP); Katsushi Tara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 193 days.

(21) Appl. No.: 11/169,314

(22) Filed: Jun. 29, 2005

(65) Prior Publication Data

US 2006/0001473 A1    Jan. 5, 2006

(30) Foreign Application Priority Data

Jun. 30, 2004    (JP) ............................. 2004-192429

(51) Int. Cl.
*H01P 1/10*    (2006.01)
*H01P 5/12*    (2006.01)

(52) U.S. Cl. ........................................ 33/103; 333/101
(58) Field of Classification Search ................ 333/101, 333/103, 262; 327/239, 427
See application file for complete search history.

(56) References Cited

U.S. PATENT DOCUMENTS

| | | | |
|---|---|---|---|
| 6,700,433 B2 * | 3/2004 | Zuk | 327/427 |
| 7,106,121 B2 * | 9/2006 | Hidaka et al. | 327/308 |
| 7,161,197 B2 * | 1/2007 | Nakatsuka et al. | 257/270 |
| 7,173,471 B2 * | 2/2007 | Nakatsuka et al. | 327/308 |

FOREIGN PATENT DOCUMENTS

| | | |
|---|---|---|
| JP | 06085641 | 3/1994 |
| JP | 11150464 | 6/1999 |

* cited by examiner

*Primary Examiner*—Dean Takaoka
(74) *Attorney, Agent, or Firm*—Stevens, Davis, Miller & Mosher, LLP

(57) ABSTRACT

A diode logic circuit which can select a high voltage from among the voltages of a number of control voltage input terminals using a number of diodes made of Schottky junctions is integrally formed on a compound semiconductor substrate on which MESFET stages for switching and for securing isolations have been formed. In addition, the MESFET stages for switching are controlled by the voltages of the number of control voltage input terminals and the MESFET stages for securing isolations are controlled by the OR voltage that is outputted from the diode logic circuit.

10 Claims, 17 Drawing Sheets

Fig. 2

| ON path | CTL1 | CTL2 | CTL3 | OR (CTL2,CTL3) | OR (CTL1,CTL3) | OR (CTL1,CTL2) |
|---|---|---|---|---|---|---|
| RF1-RF2 | High | Low | Low | Low | High | High |
| RF1-RF3 | Low | High | Low | High | Low | High |
| RF1-RF4 | Low | Low | High | High | High | Low |

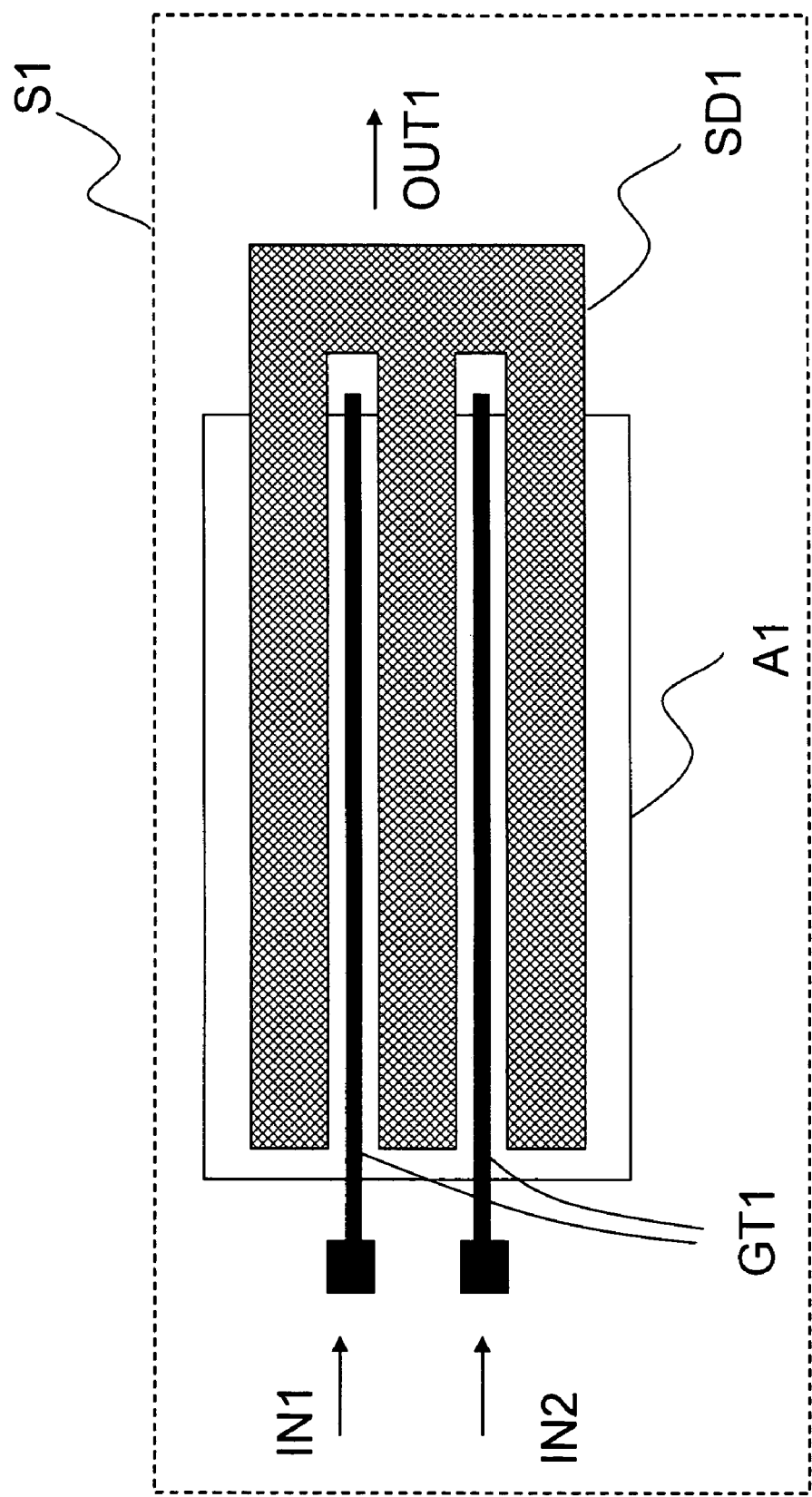

Fig. 5

| ON path | CTL1 | CTL2 | CTL3 | OR (CTL2,CTL3) | OR (CTL1,CTL3) | OR (CTL1,CTL2) | OR (CTL1,CTL2,CTL3) |
|---|---|---|---|---|---|---|---|
| RF1-RF2 | High | Low | Low | Low | High | High | High |
| RF1-RF3 | Low | High | Low | High | Low | High | High |
| RF1-RF4 | Low | Low | High | High | High | Low | High |

Fig. 10

| ON path | CTL7 | CTL8 | CTL9 | CTL10 | OR (CTL8,CTL9,CTL10) | OR (CTL7,CTL9,CTL10) | OR (CTL7,CTL8,CTL10) | OR (CTL7,CTL8,CTL9) |
|---|---|---|---|---|---|---|---|---|
| RF5-RF6 | High | Low | Low | Low | Low | High | High | High |
| RF5-RF7 | Low | High | Low | Low | High | Low | High | High |
| RF5-RF8 | Low | Low | High | Low | High | High | Low | High |
| RF5-RF9 | Low | Low | Low | High | High | High | High | Low |

Fig. 15 PRIOR ART

| ON path | CTL1 | CTL2 | CTL3 | CTL4 | CTL5 | CTL6 |
|---|---|---|---|---|---|---|
| RF1-RF2 | High | Low | Low | Low | High | High |
| RF1-RF3 | Low | High | Low | High | Low | High |
| RF1-RF4 | Low | Low | High | High | High | Low |

HIGH FREQUENCY SWITCHING CIRCUIT DEVICE

BACKGROUND OF THE INVENTION

1. Field of the Invention

The present invention relates to a high frequency switching circuit device which is made of metal-semiconductor field effect transistor stages formed on a compound semiconductor substrate, and which is appropriate for use in a communication terminal device, such as a cellular phone.

2. Prior Art

Accessing styles and radio transmission frequencies differ, depending on the standard in communication systems for cellular phones. Therefore, it is necessary to carry around cellular phones that conform to the respective standards of the country or region where the service is utilized, or to carry around one multi-band cellular phone which can be used with a number of communication systems, in order to be able to utilize a cellular phone in a number of regions in the world.

In the latter case, a cellular phone may be formed of parts that have been manufactured for the respective communication systems, so that one cellular phone can be utilized with a number of communication systems. However, the volume and the weight increase in proportion to the number of systems with which the phone can be used. Such a phone is not suitable as a portable device. Therefore, it has become necessary to provide compact lightweight high frequency parts that can be used with a number of systems.

Radio waves in a GHz band are utilized at the time of communication in mobile communication terminals such as cellular phones. At this point, field effect transistor stages made of gallium arsenic (GaAs) having excellent frequency properties at high frequencies are utilized as switching elements in antenna switching circuits, transmission/reception switching circuits and the like.

In such a field effect transistor stage, a voltage at the H level (for example, 3 V) is applied to the gate voltage terminal as a gate bias voltage that is sufficiently higher than the pinch off voltage, so as to provide a low impedance between the drain and the source, and thereby, the field effect transistor stage can be converted to the ON state. Conversely, a voltage at the L level (for example, 0 V) is applied to the gate voltage terminal as a gate bias voltage that is sufficiently lower than the pinch off voltage, so as to provide a high impedance between the drain and the source, and thereby, the field effect transistor stage can be converted to the OFF state.

FIG. 13 is a circuit diagram showing an example of a high frequency switching circuit device having the first configuration according to the prior art, where a switching element as that described above is used. This high frequency switching circuit device can be utilized, for example, as an antenna switching part. Here, an SP3T (single-pole triple-throw) switch for high frequency, which is one type of a high frequency switching circuit device, is shown as an example.

The SP3T switch for high frequency switches the output path of, for example, an inputted high frequency signal, and a first high frequency signal terminal RF1 is placed on its input side. In addition, a second high frequency signal terminal RF2, a third high frequency signal terminal RF3 and a fourth high frequency signal terminal RF4 are placed on the output side. High frequency signals that have been inputted into first high frequency signal terminal RF1 are outputted from any of second high frequency signal terminal RF2, third high frequency signal terminal RF3 and fourth high frequency signal terminal RF4. The input/output relationship of the switch may be inverted from that described above.

A first field effect transistor stage FET1, which is a switching circuit for switching a high frequency signal path, is provided between first high frequency signal terminal RF1 and second high frequency signal terminal RF2. In addition, a second field effect transistor stage FET2, which is the same type of switching circuit, is provided between first high frequency signal terminal RF1 and third high frequency signal terminal RF3. A third field effect transistor stage FET3, which is the same type of switching circuit, is provided between first high frequency signal terminal RF1 and fourth high frequency signal terminal RF4. In the following, field effect transistor stage means a switching circuit where a field effect transistor stage is used as a switching element.

Thus, a control voltage that is supplied to a first control voltage input terminal CTL1, a second control voltage input terminal CTL2 and a third control voltage input terminal CTL3 allows respective field effect transistor stages FET1, FET2 and FET3 to undergo ON/OFF control. As a result of this, first high frequency signal terminal RF1 is electrically connected to any one of second high frequency signal terminal RF2, third high frequency signal terminal RF3 and fourth high frequency signal terminal RF4. Here, symbols R1, R2 and R3 indicate resistors which are connected to the gates of the field effect transistors of first field effect transistor stage FET1, second field effect transistor stage FET2 and third field effect transistor stage FET3, respectively.

On the other hand, in the case where such GaAs FET's are used for a switching element, a problem rises where it is difficult to provide both low insertion loss and high isolation. The width of the gate voltage terminal of a single FET may be reduced so that high isolation can be gained in the FET. In the case where the width of the gate voltage terminal is reduced, however, a problem arises where ON resistance increases, and therefore, insertion loss increases. Accordingly, it is difficult to provide both low insertion loss and high isolation. Though as described above, it is difficult to provide low insertion loss and high isolation in a single FET, this problem has been solved by combining FET's.

FIG. 14 is a circuit diagram showing an example of a high frequency switching circuit device having the second configuration according to the prior art. Here, an SP3T switch for high frequency is shown as an example where one series FET and one shunt FET are combined with each signal path.

In this configuration, the RF signal that leaks via a capacitance component of the series FET in the OFF state can be led to the ground by the shunt FET in the ON state, and thereby, high isolation can be gained.

In this high frequency switching circuit device, a fourth field effect transistor stage FET 4 is placed between second high frequency signal terminal RF2 and the grounding terminal GND. As a result of this, the signal that leaks from first high frequency signal terminal R1 to second high frequency signal terminal R2 via first field effect field transistor stage FET1 is led to the ground when first high frequency signal terminal RF1 and second high frequency signal terminal RF2 are in the state of being cut off. In the same manner, a fifth field effect transistor stage FET5 is placed between third high frequency signal terminal RF3 and grounding terminal GND. Furthermore, a sixth field effect transistor stage FET6 is placed between fourth high frequency signal terminal RF4 and grounding terminal GND.

As described above, in this switching circuit, a shunt circuit is formed of fourth field effect transistor stage FET4, fifth field effect transistor stage FET5 and sixth field effect transistor stage FET6. Symbols R4, R5 and R6 indicate resistors which are connected to the gates of the field effect transistors of fourth field effect transistor stage FET4, fifth field effect transistor stage FET5 and sixth field effect transistor stage FET6, respectively. Symbols C1, C2 and C3 indicate capacitors which are connected in series to fourth field effect transistor stage FET4, fifth field effect transistor stage FET5 and sixth field effect transistor stage FET6.

These field effect transistor stages FET1 to FET6 undergo ON/OFF control by means of a control voltage that is supplied to first control voltage input terminal CTL1 to sixth control voltage input terminal CTL6.

Concretely speaking, as shown in the control logic table of FIG. 15, fifth control voltage input terminal CTL5 and sixth control voltage input terminal CTL6 become of the high state when first control voltage input terminal CTL1 becomes of the high state. In the same manner, fourth control voltage input terminal CTL4 and sixth control voltage input terminal CTL6 become of the high state when second control voltage input terminal CTL2 becomes of the high state. In addition, fourth control voltage input terminal CTL4 and fifth control voltage input terminal CTL5 become of the high state when third control voltage input terminal CTL3 becomes of the high state. As a result, isolation properties between the respective high frequency signals are appropriately maintained.

In order to adopt the configuration of an SP3T switching circuit for high frequency that has such a shunt FET for securing isolation, however, control voltage input terminals for three systems become necessary only to control the control voltages that are independently applied to the gate voltage terminals of the respective shunt FET's. Accordingly, control voltage input terminals for six systems, including those for controlling the series FET's, become necessary. As a result, a problem arises where the number of pins for the package of the high frequency switching circuit device increases and the size of the package increases, and thus, the configuration is unsuitable for a portable terminal where miniaturization of the device is required.

The first method, which is the simplest method, for avoiding an increase in the number of the control voltage input terminals as described above is to adopt a configuration of a high frequency switching circuit device having the third configuration according to the prior art, as shown in FIG. 16. That is to say, one series FET and two shunt FET's are combined with each signal path.

Concretely speaking, in the SP3T switch configuration shown in the above, a seventh field effect transistor stage FET7 is added between second high frequency signal terminal RF2 and grounding terminal GND. In addition, in the same manner, an eighth field effect transistor stage FET8 is added between third high frequency signal terminal RF3 and grounding terminal GND. Furthermore, a ninth field effect transistor stage FET9 is added between fourth high frequency signal terminal RF4 and grounding terminal GND.

Thus, first control voltage input terminal CTL1 allows first field effect transistor stage FET1, fifth field effect transistor stage FET5 and sixth field effect transistor stage FET6 to undergo ON/OFF control. In the same manner, second control voltage input terminal CTL2 allows second field effect transistor stage FET2, fourth field effect transistor stage FET4 and ninth field effect transistor stage FET9 to undergo ON/OFF control. Furthermore, third control voltage input terminal CTL3 allows third field effect transistor stage FET3, seventh field effect transistor stage FET7 and eighth field effect transistor stage FET8 to undergo ON/OFF control.

As a result, control voltage input terminals for three systems allow isolation to be appropriately maintained. Symbols R7, R8 and R9 indicate resistors which are connected to the gates of seventh field effect transistor stage FET7, eighth field effect transistor stage FET8 and ninth field effect transistor stage FET9, respectively. Symbols C4, C5 and C6 indicate capacitors which are connected in series to seventh field effect transistor stage FET7, eighth field effect transistor stage FET8 and ninth field effect transistor stage FET9, respectively.

In addition to the above, a second method for eliminating the control voltage input terminal for the SPDT switch by incorporating a differential amplifier circuit and a symmetrical control voltage generation circuit by means of an inverter circuit into a high frequency switching circuit device is disclosed in Patent Document 1. In addition, a third method for eliminating the control voltage input terminal by connecting the control voltage input terminal of the series FET to the grounding terminal, connecting the drain or the source of the shunt FET to the power supply terminal, and applying the control voltage of the shunt FET to the drain or the source of the Series FET is disclosed in Patent Document 2.

Patent Document 1: Japanese Unexamined Patent Publication H6 (1994)-85641

Patent Document 2: Japanese Unexamined Patent Publication H11 (1999)-150464

According to the above described methods, however, the following problems arise.

According to the above described first method, the number of FET's increases, increasing the size of the GaAs chip. In addition, together with this, one shunt FET is added to each signal path, and thereby, an FET in the OFF state, that is to say, a capacitance component, is added to the ON path in such a manner as to be connected in parallel. Therefore, frequency properties of the insertion loss of the ON path deteriorate.

In addition, according to the second method, it is extremely difficult to fabricate a differential amplifier circuit and an inverter circuit within a GaAs chip. Therefore, the number of external pins increases, the number of parts increases, and the number of total process steps for the formation of FET's increases.

Furthermore, according to the third method, the drain or source voltage of each FET is controlled, and therefore, it is necessary to connect a capacitor for cutting a DC anterior or posterior the drains and the sources of many FET's. Accordingly, it is necessary to incorporate a large number of capacitors in a high frequency switching circuit, and the area of the chip and the number of parts increases.

SUMMARY OF THE INVENTION

An object of the present invention is to solve the above described problems and provide a high frequency switching circuit device where a switch element can be controlled with precision without an increase in the chip size, deterioration of frequency characteristics of the insertion loss of an ON path, or an increase in the number of control signals that are to be inputted through external pins.

Another object of the present invention is to provide a high frequency switching circuit device for implementing a compact and lightweight antenna switch for use in a compact and lightweight cellular phone, even when the number of bands is further increased in the development of cellular phones.

Still another object of the present invention is to provide a high frequency switching circuit device having high performance by securing high isolation, which is difficult to achieve in the case of multiple bands.

In order to achieve the above described objects, the present invention essentially adopts the technical configuration described below.

A high frequency switching circuit device according to the present invention allows at least one of a number of high frequency signal paths to conduct and for cutting off the rest, and is provided with: a compound semiconductor substrate; a number of switching elements which are made of metal-semiconductor field effect transistors formed on the compound semiconductor substrate and which interrupt the number of high frequency signal paths respectively; a number of control voltage input terminals for individually supplying a number of control voltages to the number of switching elements; and a diode logic circuit which is made of a number of diodes that are formed on the compound semiconductor substrate as metal-semiconductor Schottky junctions and which synthesizes logic of the control voltages that are inputted into the number of control voltage input terminals. Here, a logic synthesis voltage that is outputted from the diode logic circuit is supplied to the number of switching elements as another control voltage.

In the above described high frequency switching circuit device according to the present invention, for example, each of the number of switching elements is formed of a series switching element that has been inserted into each of the number of high frequency signal paths and a shunt switching element that is connected between each of the number of high frequency signal paths and the ground. In this case, the diode logic circuit outputs the logical sum of at least 2 control voltages of which the combination differs, for example, for each of the number of switching elements as the individual logic synthesis voltage. In addition, the number of control voltages are individually supplied to the gate electrode of each series switching element of the number of switching elements, and the individual logic synthesis voltages that are outputted from the diode logic circuit are supplied to the gate electrode of each shunt switch element of the number of switching elements as the other control voltage, respectively.

In the above described configuration, the individual logic synthesis voltages which are supplied to the gate electrode of a shunt switching element of one switching element from among the number of switching elements are, for example, the logical sum of all of the control voltages that are supplied to the remaining switching elements from among the number of switching elements.

In the above described high frequency switching circuit device according to the present invention, the series switching element and shunt switch element are, for example, respectively formed of a series circuit of a number of metal-semiconductor field effect transistors. In this case, the diode logic circuit outputs the logical sum of all of the control voltages that are inputted into the number of control voltage input terminals as a common logic synthesis voltage. Thus, regarding the series switching element and shunt switching element of each of the number of switching elements, the common logical sum voltage that is outputted from the diode logic circuit is supplied to the mutual connection points of the number of metal-semiconductor field effect transistors as the other control voltage.

In the above described configuration, the individual logic synthesis voltages which are supplied to the gate electrode of the shunt switching element of one switching element from among the number of switching elements are, for example, the logical sum of all of the control voltages that are supplied to the remaining switching elements from among the number of switching elements.

In the above described high frequency switching circuit device according to the present invention, the series switching element and shunt switching element are, for example, respectively formed of a series circuit of a number of metal-semiconductor field effect transistors. In this case, regarding the respective series switching elements of the number of switching elements, the individual logic synthesis voltages that are outputted from the diode logic circuit are supplied to the mutual connection points of the number of metal-semiconductor field effect transistors as the other control voltage, and in addition, regarding the respective shunt switching elements of the number of switching elements, the number of control voltages may be respectively supplied to the mutual connection points of the number of metal-semiconductor field effect transistors.

In the above described configuration, the individual logic synthesis voltages that are supplied to the gate electrode of the shunt switching element of one switching element from among the number of switching elements and to the mutual connection points of the metal-semiconductor field effect transistors that form the series switching element are, for example, the logical sum of all of the control voltages that are supplied to the remaining switching elements from among the number of switching elements.

In the above described high frequency switching circuit device according to the present invention, each of the number of switching elements may be made of a series switching element that is inserted into each of the number of high frequency signal paths, and the series switching element may be formed of a series circuit of a number of metal-semiconductor field effect transistors. In this case, the diode logic circuit outputs the logical sum of all of the control voltages that are inputted into the number of control voltage input terminals as a common logical synthesis voltage. Thus, the number of control voltages are supplied to the gate electrode of each series switch element of the number of switching elements, and regarding the respective series switching elements of the number of switching elements, the common logic synthesis voltage that is outputted from the diode logic circuit is supplied to the mutual connection points of the number of metal-semiconductor field effect transistors as the other control voltage.

The above described high frequency switching circuit device according to the present invention may have a configuration as described below, in the case where each of the number of switching elements is made of a series switching element that is inserted into each of the number of high frequency signal paths, the series switching element is formed of a series circuit of a number of metal-semiconductor field effect transistors, as described above. That is to say, the diode logic circuit respectively outputs the logical sums of control voltages of which the combination differs for each of the number of switching elements as individual logic synthesis voltages. Thus, the number of control voltages are supplied to the gate electrode of each series switch element of the number of switching elements, and regarding the respective series switching elements of the number of switching elements, the individual logic synthesis voltages that are outputted from the diode logic circuit is supplied to the mutual connection points of the number of metal-semiconductor field effect transistors as the other control voltage.

In the above described configuration, the individual logic synthesis voltages that are supplied to the mutual connection points of the metal-semiconductor field effect transistors that form the series switching element of one switching element from among the number of switching elements are, for example, the logical sum of all of the control voltages that are supplied to the remaining switching elements from among the number of switching elements.

The above described high frequency switching circuit device according to the present invention may have the following configuration, in the case where each of the number of switching elements is made of a series switching element that is inserted into each of the number of high frequency signal paths, and the series switching element is formed of a series circuit of a number of metal-semiconductor field effect transistors, as described above. That is to say, the series switching elements of some switching elements from among the number of switching elements partially share metal-semiconductor field effect transistors. In addition, the diode logic circuit outputs the logical sum of the control voltages that correspond to some switching elements from among the number of switching elements as a logical sum synthesis voltage. Thus, regarding some switching elements from the number of switching elements, the control voltages that correspond to some switching elements from among the number of switching elements are individually supplied to the gate electrodes of the metal-semiconductor field effect transistors in the non-shared portion. In addition, the logical sum synthesis voltage that is outputted from the diode logic circuit is supplied to the gate electrodes of the metal-semiconductor field effect transistors in the shared portion. Furthermore, regarding the remaining switching elements from among the number of switching elements, the control voltages that correspond to the remaining switching elements from among the number of switching elements are individually supplied to the gate electrodes of the metal-semiconductor field effect transistors.

In the above described configuration, the diode logic circuit outputs the logical sum of all of the control voltages that are inputted into the number of control voltage input terminals as a common logic synthesis voltage. Thus, regarding the respective series switching elements of the number of switching elements, the common logical synthesis voltage that is outputted from the diode logic circuit is supplied to the mutual connection points of the number of metal-semiconductor field effect transistors as the other control voltage.

In the above described configuration, the number of high frequency signal paths include, for example, a received high frequency signal path and a transmitted high frequency signals path, and a switching element that includes a series switching element that partially shares the metal-semiconductor field effect transistors is placed in the received high frequency signal path.

As described above, a high frequency switching circuit device according to the present invention uses diodes made of Schottky junctions that can be fabricated at the same time in an FET fabricating process, in such a manner that a diode logic circuit for logical synthesis of voltages from a number of control voltage input terminals, for example, for selecting and outputting the highest voltage from among, for example, a number of control voltage input terminals is integrally formed on a compound semiconductor substrate. As a result, a shunt switching element for securing isolation can be controlled by the voltage at the control voltage input terminal of the series switching element, and the control system and the like can be miniaturized, in comparison with the prior art. Therefore, the number of package pins and the package size are reduced, and operability is enhanced when the number of bands of cellular phones is increased, and the invention can contribute to the miniaturization of cellular phones.

In addition, this diode logic circuit is connected to a source or a drain of the FET's that form the switching element, that is to say, to the middle connection point of the series circuit of the number of FET's, and thereby, the potential can be fixed without adding a power supply terminal. As a result of this, a high frequency switching circuit device having excellent properties, such as low insertion loss, high isolation and low distortion, can be implemented.

In addition, in the case where the power that is handled differs depending on the path that is switched as a result of transmission/reception switching, some field effect transistor stages on the reception side handling low power are shared, and furthermore, these shared field effect transistor stages are controlled by a diode logic circuit, and thereby, the chip size can be reduced without increasing the number of control systems, and the invention can further contribute to the miniaturization of cellular phones.

BRIEF DESCRIPTION OF THE DRAWINGS

FIG. 2 is a diagram showing the control logic table of diode logic circuit OR1 that is included in the high frequency switching circuit device of FIG. 1;

FIG. 3B is a plan diagram showing an example of the structure of diodes that form the diode logic circuit shown in FIG. 3A;

FIG. 5 is a diagram showing the control logic table of diode logic circuit OR2 that is included in the high frequency switching circuit device of FIG. 4;

FIG. 10 is a diagram showing the control logic table of diode logic circuit OR3 that is included in the high frequency switching circuit device of FIG. 9;

FIG. 15 is a diagram showing the control logic table of the high frequency switching circuit device of FIG. 14.

DESCRIPTION OF THE PREFERRED EMBODIMENTS

In the following, the present embodiments are described in reference to the drawings.

Embodiment 1

Figure 1:
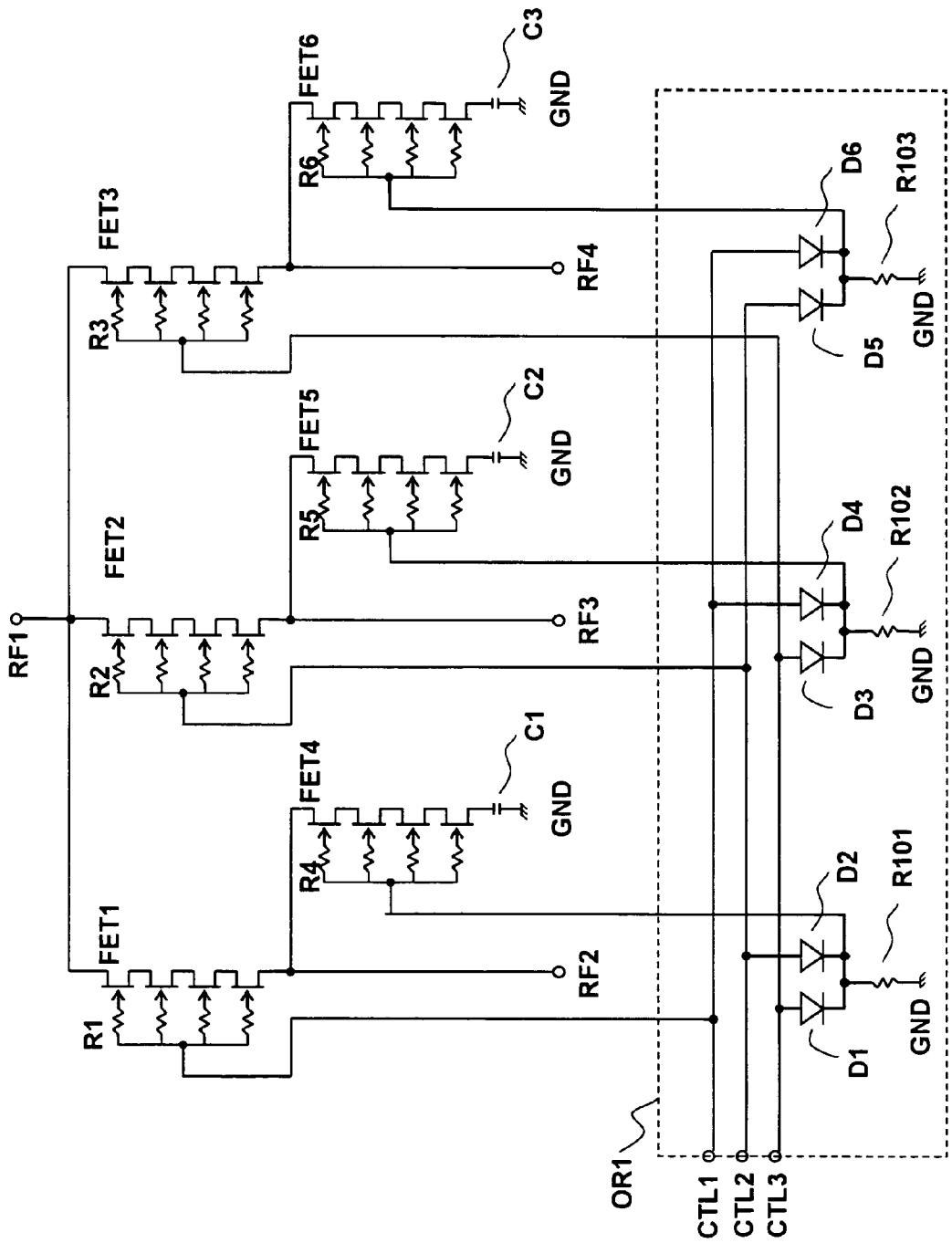
FIG. 1 is a circuit diagram showing the circuit configuration of a high frequency switching circuit device, for example, an SP3T switch, according to the first embodiment.

FIG. 1 is a circuit diagram showing an example of a high frequency switching circuit device according to Embodiment 1 of the present invention, and concretely shows a circuit configuration of an SP3T switch for high frequency.

In FIG. 1, first high frequency signal terminal RF1 to fourth high frequency signal terminal RF4, first field effect transistor stage FET1 to sixth field effect transistor stage FET6, as well as control voltage input terminals CTL1 to CTL3, are the same as those according to the prior art. First diode D1 to sixth diode D6 are diodes that form a diode logic circuit OR1, and have been prepared as metal-semiconductor Schottky junctions, of the same material as the gate electrodes of metal-semiconductor FET's. These diodes can be fabricated at the same time in an FET fabricating process.

The anode of first diode D1 is connected to third control voltage input terminal CTL3, and the cathode is connected to the gate voltage terminal of fourth field effect transistor stage FET4 and grounding terminal GND via resistor R101. The anode of second diode D2 is connected to second control voltage input terminal CTL2, and the cathode is connected to the cathode of first diode D1.

The anode of third diode D3 is connected to third control voltage input terminal CTL3, and the cathode is connected to the gate voltage terminal of fifth field effect transistor stage FET5 and grounding terminal GND via resistor R102. The anode of fourth diode D4 is connected to first control voltage input terminal CTL1, and the cathode is connected to the cathode of third diode D3.

The anode of fifth diode D5 is connected to second control voltage input terminal CTL2, and the cathode is connected to the gate voltage terminal of sixth field effect transistor stage FET6 and grounding terminal GND via resistor R103. The anode of sixth diode D6 is connected to first control voltage input terminal CTL1, and the cathode is connected to the cathode of fifth diode D5.

Next, the operation is described. The system operates as follows, in the case, for example, where the path between first high frequency signal terminal RF1 and second high frequency signal terminal RF2 is desired to be converted to the ON state. A voltage at the H level (for example, 3V) is inputted into first control voltage input terminal CTL1, and a voltage at the L level (for example, 0 V) is inputted into second control voltage input terminal CTL2 and third control voltage input terminal CTL3. As a result of this, first field effect transistor stage FET1 becomes of the ON state, and second field effect transistor stage FET2 and third field effect transistor stage FET3 become of the OFF state.

At this time, the cathode of first diode D1, of which the anode is connected to third control voltage input terminal CTL3, and the cathode of second diode D2, of which the anode is connected to second control voltage input terminal CTL2, are connected to the voltage gate terminal of fourth field effect transistor stage FET4. As a result of this, the anodes of first diode D1 and second diode D2 both become of the L level voltage potential. The cathodes of first diode D1 and second diode D2 are connected to grounding terminal GND at the L level potential via resistor R101. Accordingly, the potential difference between the cathode and the anode of each of first diode D1 and second diode D2 is no higher than threshold value Vf of the diode, and therefore, no current flows through first diode D1 or second diode D2. As a result, the OR potential of the two control voltages which are supplied to second control voltage input terminal CTL2 and third control voltage input terminal CTL3, that is to say, the voltage at the L level, is inputted into the gate voltage terminal of fourth field effect transistor stage FET4. Accordingly, fourth field effect transistor stage FET4 becomes of the OFF state.

In addition, the cathode of third diode D3, of which the anode is connected to third control voltage input terminal CTL3 and the cathode of fourth diode D4, of which the anode is connected to first control voltage input terminal CTL1, are connected to the gate voltage terminal of fifth field effect transistor stage FET5. As a result, the anode of third diode D3 becomes of the L level potential, and the anode of fourth diode D4 becomes of the H level potential. The cathodes of third diode D3 and the fourth diode are connected to grounding terminal GND at the L level potential via resistor R102. Accordingly, the potential difference between the cathode and the anode of fourth diode D4 exceeds threshold value Vf of the diode, and therefore, a current flows through fourth diode D4. As a result of this, the potential that is gained by subtracting the voltage drop in the diode (no greater than 0.7 V) from the H level voltage appears at the cathode of fourth diode D4. In addition, at this time, the potential difference between the cathode and the anode of third diode D3 is no greater than threshold value Vf of the diode (reverse bias state), and therefore, no current flows through third diode D3. As a result, the OR potential of the two control voltages which are supplied to first control voltage input terminal CTL1 and third control voltage input terminal CTL3, precisely, the potential gained by subtracting the voltage drop in the diode from the H level voltage, is applied to the gate voltage terminal of fifth field effect transistor stage FET5. That is to say, a gate bias voltage that is sufficiently higher than the pinch-off voltage of the field effect transistor is applied to fifth field effect transistor stage FET5. Accordingly, fifth field effect transistor stage FET5 becomes of the ON state.

In the same manner, the cathode of fifth diode D5 of which the anode is connected to second control voltage input terminal CTL2 and the cathode of sixth diode D6 of which the anode is connected to first control voltage input terminal CTL1 are connected to the gate terminal of sixth field effect transistor stage FET6. As a result, the anode of fifth diode D5 becomes of the L level potential, and the anode of sixth diode D6 becomes of the H level potential. The cathodes of fifth diode D5 and sixth diode D6 are connected to grounding terminal GND at the L level potential via resistor R103. Accordingly, the potential difference between the cathode and the anode of sixth diode D6 exceeds threshold value Vf, and therefore, a current flows through sixth diode D6. As a result of this, the potential that is gained by subtracting the voltage drop in the diode from the H level voltage appears at the cathode of sixth diode D6. In addition, the potential difference between the cathode and the anode of fifth diode D5 is no higher than threshold value Vf of the diode (reverse bias state), and therefore, no current flows through fifth diode D5. As a result, the OR potential of the two control voltages which are supplied to first control voltage input terminal CTL1 and second control voltage input terminal CTL2, precisely, the potential that is gained by subtracting the voltage drop in the diode from the H level voltage, is applied to the gate voltage terminal of sixth field effect transistor stage FET6. That is to say, a gate bias voltage that is sufficiently higher than the pinch-off voltage of the field effect transistor is applied to sixth field effect transistor stage FET6. Accordingly, sixth field effect transistor stage FET6 becomes of the ON state.

In the same manner, when the path between first high frequency terminal RF1 and third high frequency signal terminal RF3 is desired to be converted to the ON state, and the path between first high frequency signal terminal RF1 and fourth high frequency signal terminal RF4 is desired to be converted to the ON state, control voltages, as shown in the control logic table of FIG. 2, may be supplied to first control voltage input terminal CTL1, second control voltage input terminal CTL2 and third control voltage input terminal CTL3. At this time, diode logic circuit OR1 operates, as shown in the control logic table of FIG. 2.

Figure 14:
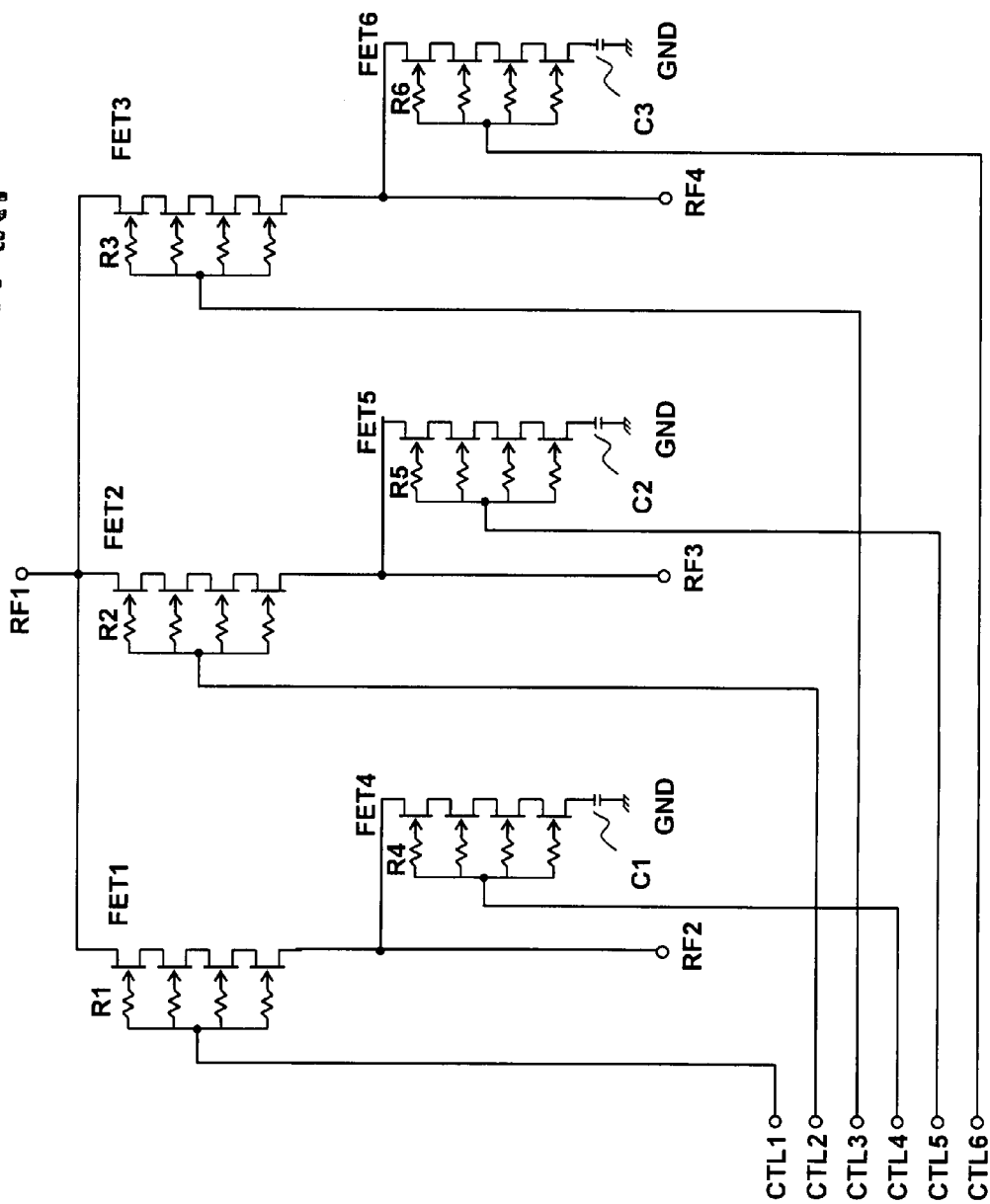
FIG. 14 is a circuit diagram showing the circuit configuration of a second high frequency switching circuit device according to the prior art, for example, an SP3T switch having a shunt FET and six systems of control signal input terminals.
Figure 16:
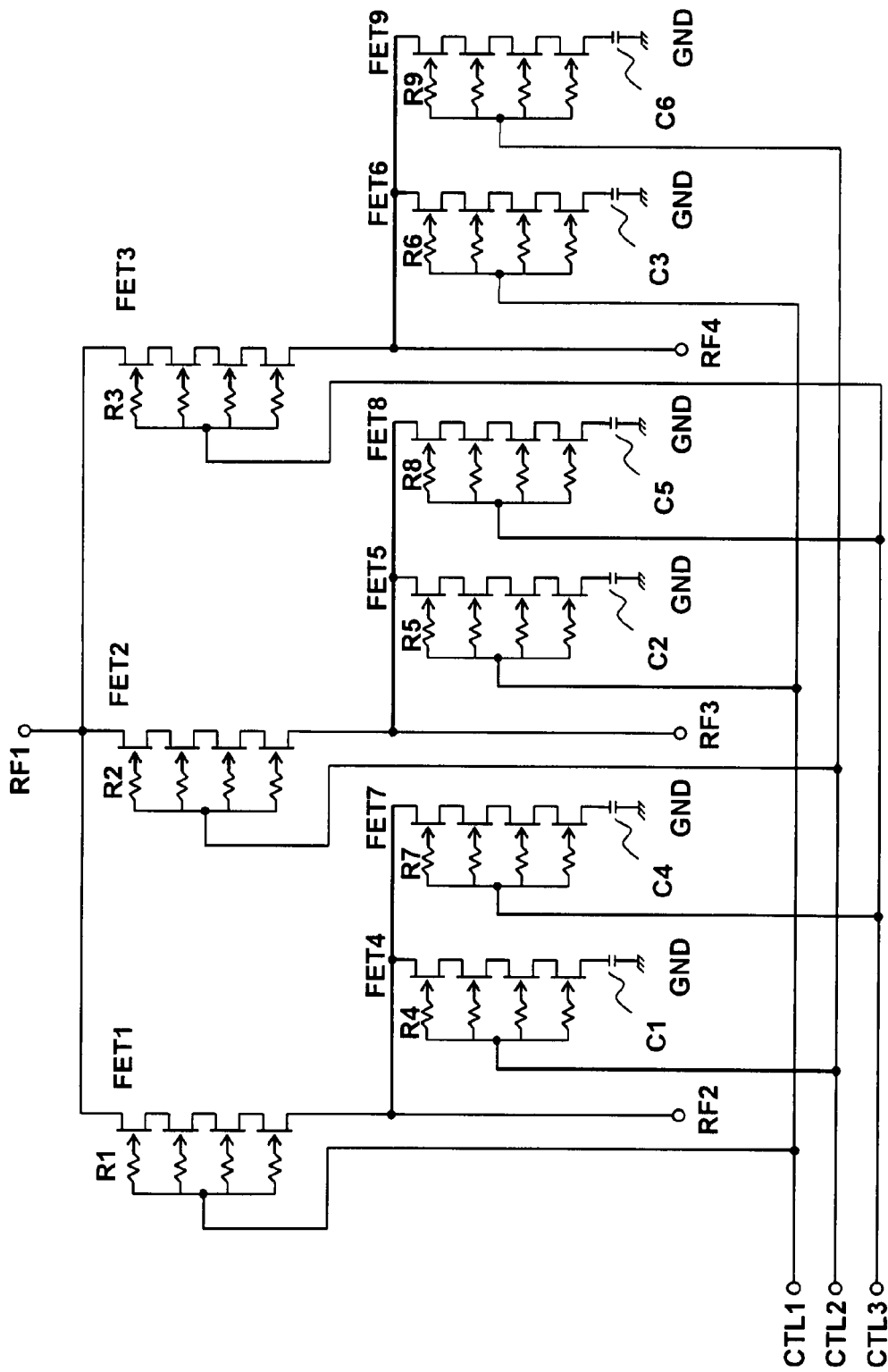
FIG. 16 is a circuit diagram showing the circuit configuration of a third high frequency switching circuit device according to the prior art, for example, an SP3T switch having a shunt FET and three systems of control signal input terminals.

The high frequency switching circuit according to the present Embodiment 1 is different from the high frequency switching circuit according to the prior art in the following manner. Namely, control voltage input terminals for six systems are required for the control of six field effect transistor stages, in order to secure isolation properties in the second configuration shown in FIG. 14 according to the prior art. In addition, the number of shunt FET's has been increased in order to secure isolation by means of control voltage input terminals for three systems in the third configuration shown in FIG. 15 according to the prior art. In the high frequency switching circuit according to the present Embodiment 1, however, it becomes possible to control six field effect transistor stages with control voltage input terminals for three systems without increasing the number of shunt FET's. Therefore, the number of pins in the package is reduced, the size of the package is reduced, and operability is increased, which can contribute to miniaturization of cellular phones.

Figure 3A:
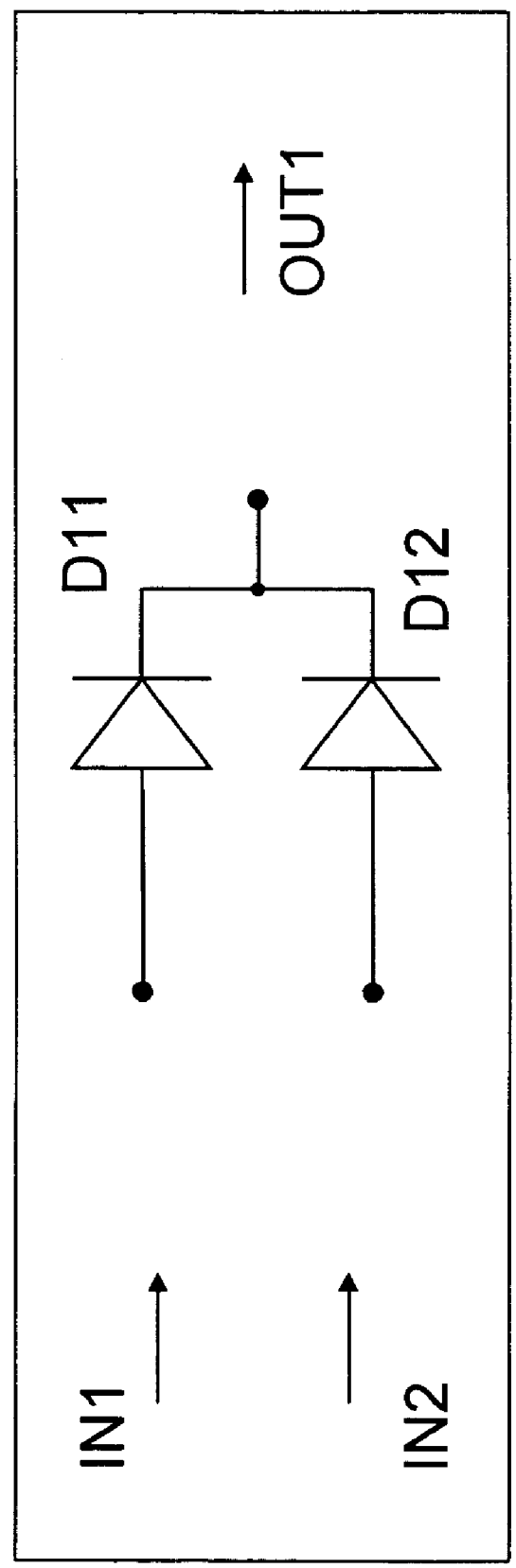
FIG. 3A is a circuit diagram showing an example of a diode logic circuit that is included in the high frequency switching circuit device of FIG. 1.

In addition, FIGS. 3A and 3B show a circuit diagram and an example of the pattern structure when diodes in diode logic circuit OR1 are fabricated on a GaAs substrate so as to be integrated into a switching element. FIGS. 3A and 3B show an example of a case where a diode logic circuit is formed using two diodes D11 and D12. First input terminal IN1 and second input terminal IN2 correspond to the anodes of two diodes D11 and D12, and are connected to the control voltage input terminals of FIG. 1, respectively. First output terminal OUT1 corresponds to the cathode shared by these two diodes D11 and D12. Namely, the OR voltage of the control voltages which are supplied to the control voltage input terminals connected to first input terminal IN1 and second input terminal IN2 is outputted to first output terminal OUT1.

In the case where these two diodes are fabricated at the same time in an FET fabricating process, the anodes of the two diodes into which signals from first input terminal IN1 and second input terminal IN2 are inputted are formed of an active layer Al that is formed on a GaAs substrate S1 and gate electrodes GT1 that are formed on this active layer Al. In addition, the cathode shared by the two diodes is formed of an ohmic electrode SD1 for the source and the drain that is formed in comb shape on this active layer Al so as to face gate electrodes GT1.

At this time, the length of the gate that forms a diode fabricated on a GaAs substrate may be no greater than $\frac{1}{10}$ of the length of the gates of a field effect transistor stage for transmitting a high frequency signal, and the area occupied by the gate of the diode within the semiconductor substrate is also no greater than $\frac{1}{10}$ of the area occupied by the gates of the field effect transistor stage. In addition, in the case where a diode logic circuit is formed using three or more diodes, in the same manner, gate electrodes of which the number is the same as that of input terminals are formed, and furthermore, an ohmic electrode shared by the sources and the drains is formed in comb shape, and thereby, it becomes possible to fabricate a diode logic circuit. Here, it is not necessary to form the ohmic electrode shared by the sources and the drains in comb shape.

According to Embodiment 1 of the present invention, the diode is made of a Schottky junction that can be fabricated of the same material and at the same time as the gate electrode of a metal-semiconductor FET that is formed on a compound semiconductor substrate, as shown in FIGS. 3A and 3B, in an FET fabricating process, and furthermore, it is possible to fabricate the diode in an area that is no greater than $\frac{1}{10}$ of the area occupied by the FET. Therefore, the chip size can be significantly reduced, and reduction in the cost of manufacture can be achieved, in comparison with the prior art.

Embodiment 2

Figure 4:
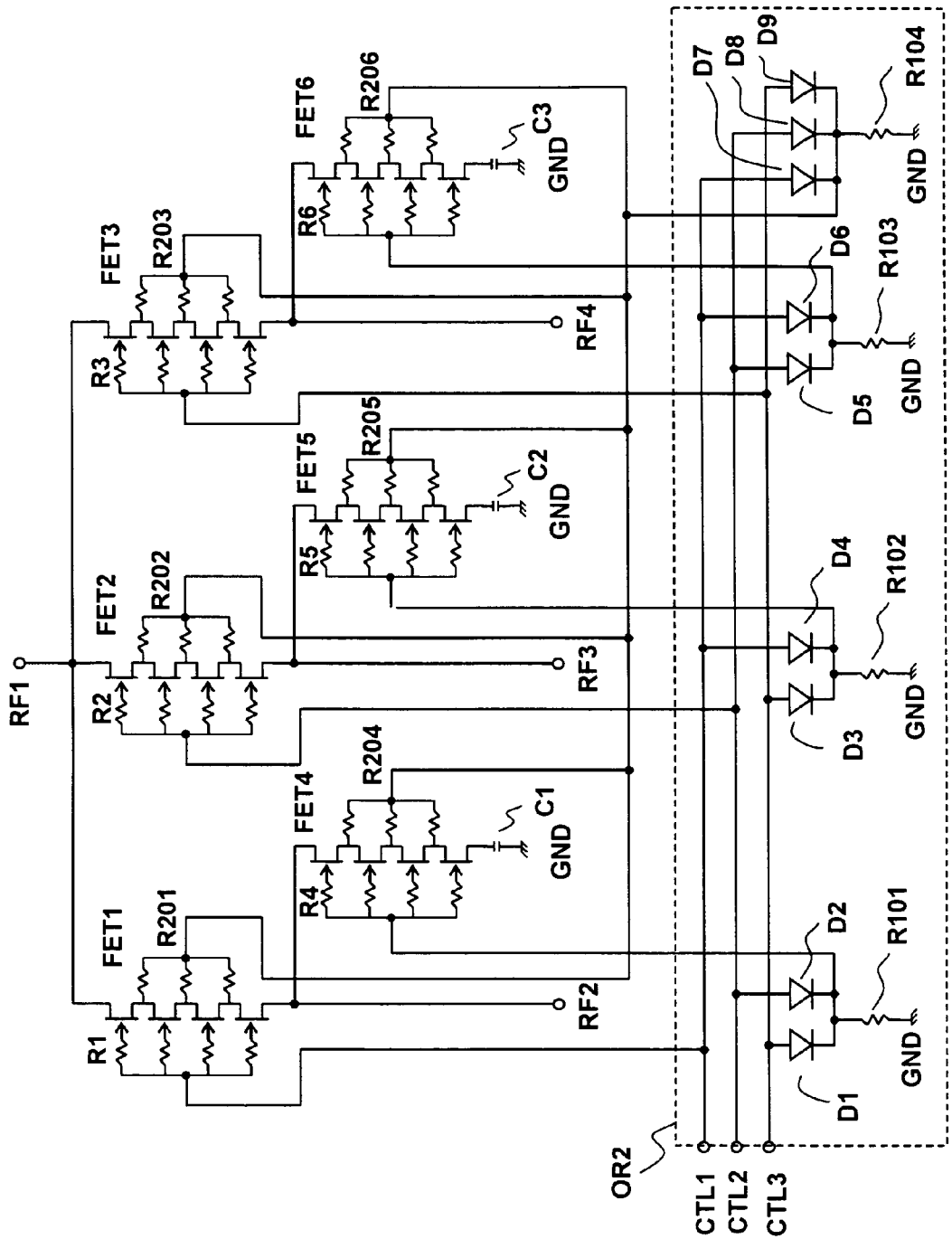
FIG. 4 is a circuit diagram showing the circuit configuration of a high frequency switching circuit device, for example, an SP3T switch, according to the second embodiment.

FIG. 4 is a diagram showing an example of a high frequency switching circuit device according to Embodiment 2 of the present invention. FIG. 4 concretely shows the circuit configuration of an SP3T switch for high frequency.

In FIG. 4, first high frequency signal terminal RF1 to fourth high frequency signal terminal RF4, first field effect transistor stage FET1 to sixth field effect transistor stage FET6, and control voltage input terminals CTL1 to CTL3 are the same as those according to the prior art. First diode D1 to sixth diode D6 are the same as those in Embodiment 1. First diode D1 to ninth diode D9 are diodes that form a diode logic circuit OR2, and are made of Schottky junctions that can be fabricated of the same material and at the same time as the gate electrode of a metal-semiconductor FET in an FET fabricating process.

The anodes of seventh diode D7, eighth diode D8 and ninth diode D9 are connected to first control voltage input terminal CTL1, second control voltage input terminal CTL2 and third control voltage input terminal CTL3, respectively. The cathodes are connected to grounding terminal GND via resistor R104. Furthermore, the cathodes are connected to the middle connection points of the number of field effect transistors that form the respective field effect transistor stages from first field effect transistor stage FET1 to sixth field effect transistor stage FET6, that is to say, sources or drains, via resistors R201 to R206.

Next, the operation is described. FIG. 5 shows a control logic table of the diode logic circuit according to the present embodiment. When the paths between first high frequency signal terminal RF1 and second high frequency signal terminal RF2, between first high frequency signal terminal RF1 and third high frequency signal terminal RF3, and between first high frequency signal terminal RF1 and fourth high frequency signal terminal RF4 are respectively in the ON state, respective field effect transistor stages FET1 to FET6 operate in the same manner as in Embodiment 1.

In addition, the anodes of seventh diode D7, eighth diode D8 and ninth diode D9 are connected to control voltage input terminals CTL1, CTL2 and CTL3, respectively, and the cathodes are connected to a common grounding terminal GND via resistor R104. As a result, the potential difference between the cathode and the anode of any one of seventh diode D7, eighth diode D8 and ninth diode D9 is no less than threshold value Vf of the diode, and therefore, a current flows through the relevant diode, and the potential that is gained by subtracting the voltage drop in the diode from the voltage at the H level appears in the cathode of the relevant diode.

Accordingly, the middle connection points of the number of field effect transistors that form the respective field effect transistor stages from first field effect transistor stage FET1 to sixth field effect transistor stage FET6, that is to say, sources or drains, are fixed at the OR voltage of control voltage input terminals CTL1, CTL2 and CTL3, precisely, the voltage that is gained by subtracting the voltage drop in the diode from the voltage at the H level.

In the high frequency switching circuit according to the present Embodiment 2, the same effects as in Embodiment 1 are gained, and in addition, the middle connection points of the number of field effect transistors are fixed at the voltage that is gained by subtracting the voltage drop in the diode from the voltage at the H level. In contrast to this, when the field effect transistors are in the ON state, the voltage at the H level or the voltage that is gained by subtracting the voltage drop in the diode from the voltage at the H level is supplied as the gate terminal voltage. Therefore, the forward bias operation becomes possible at no lower than 0 V, without fail.

In addition, when the field effect transistors are in the OFF state, the voltage at the L level is supplied as the gate terminal voltage. Accordingly, the field effect transistors can be cut off with the reverse bias of (voltage at L level)− (voltage gained by subtracting voltage drop in diode from voltage at H level), without fail. That is to say, ON/OFF control can be performed without fail, leakage into a signal path in the OFF state can be prevented, and a high frequency switching circuit device having excellent properties, such as high isolation and low distortion, can be implemented. In addition, no particular power supply is necessary for fixing the potential of the middle connection points of the number of field effect transistors, or no terminal for power supply is necessary. Accordingly, the number of terminals for fixing the potential does not increase.

Embodiment 3

Figure 6:
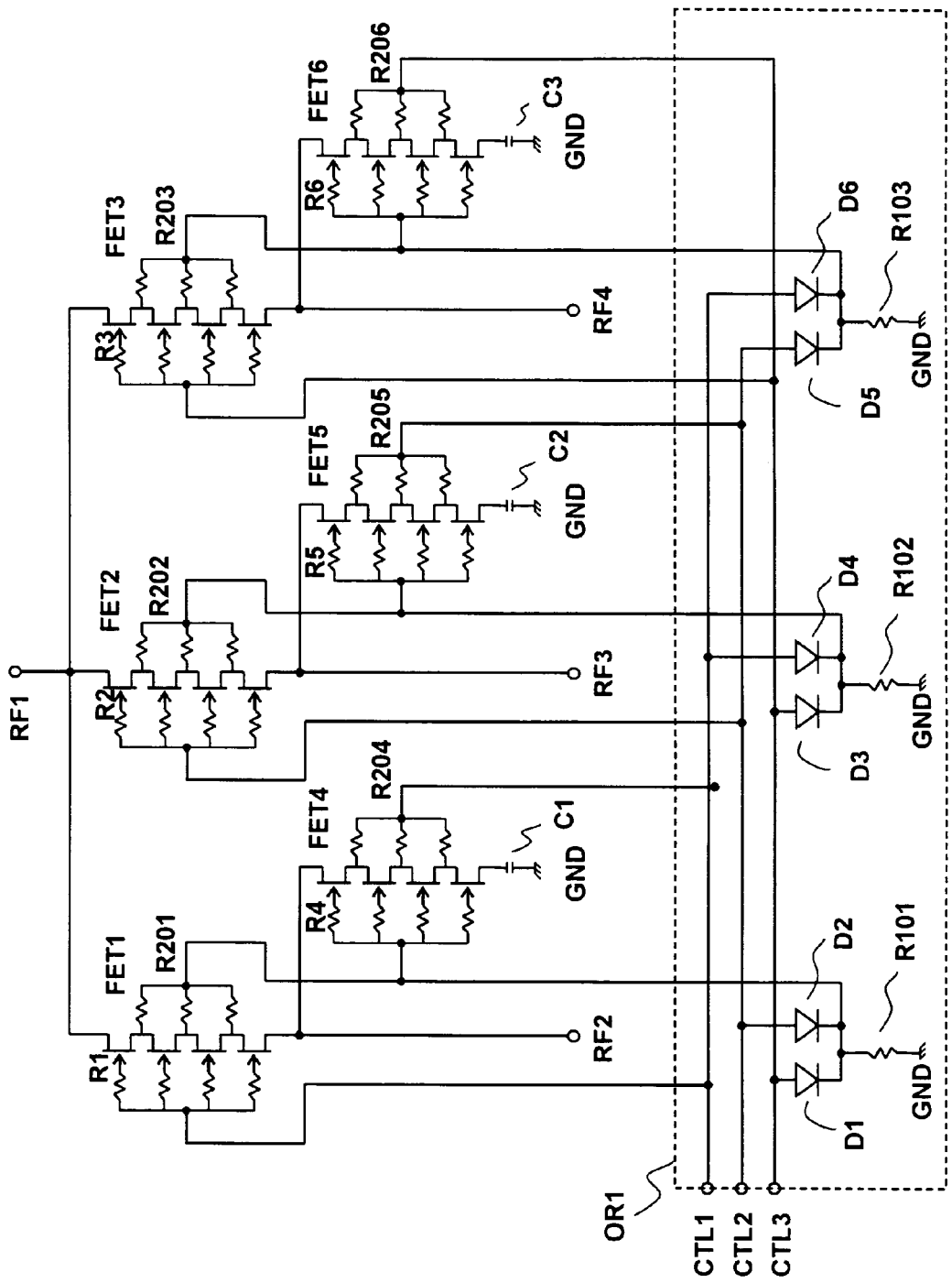
FIG. 6 is a circuit diagram showing the circuit configuration of a high frequency switching circuit device, for example, an SP3T switch, according to the third embodiment.

FIG. 6 is a diagram showing an example of a high frequency switching circuit device according to Embodiment 3 of the present invention. Concretely speaking, FIG. 6 shows the circuit configuration of an SP3T switch for high frequency.

In FIG. 6, first high frequency signal terminal RF1 to fourth high frequency signal terminal RF4, first field effect transistor stage FET1 to sixth field effect transistor stage FET6, and control voltage input terminals CTL1 to CTL3 are the same as those according to the prior art. First diode D1 to sixth diode D6 are diodes that form diode logic circuit OR1, which is the same as that of Embodiment 1.

In the circuit configuration of the SP3T switch for high frequency according to the present Embodiment 3, the gate voltage terminal of first field effect transistor stage FET1 is connected to the middle connection point of a number of field effect transistors that form fourth field effect transistor stage FET4, via resistor R204. In the same manner, the gate voltage terminal of second field effect transistor stage FET2 is connected to the middle connection point of a number of field effect transistors that form fifth field effect transistor stage FET5, via resistor R205. Furthermore, the gate voltage terminal of third field effect transistor stage FET3 is connected to the middle connection point of a number of field effect transistors that form sixth field effects transistor stage FET6, via resistor R206.

In addition, the gate voltage terminal of fourth field effect transistor stage FET4 is connected to the middle connection point of a number of field effect transistors that form first field effect transistor stage FET1, via resistor R201. In the same manner, the gate voltage terminal of fifth field effect transistor stage FET5 is connected to the middle connection point of a number of field effect transistors that form second field effect transistor stage FET2, via resistor R202. Furthermore, the gate voltage terminal of sixth field effect transistor stage FET6 is connected to the middle connection point of a number of field effect transistors that form third field effect transistor stage FET3, via resistor R203.

Next, the operation is described. The operation of each diode of diode logic circuit OR1 is the same as in Embodiment 1, and follows the control logic table shown in FIG. 2. In the circuit according to the present embodiment, the middle connection point of a series field effect transistor stage is always fixed at the potential of the gate terminal voltage of a shunt field effect transistor stage, and the middle connection point of a shunt field effect transistor stage is always fixed at the potential of the gate terminal voltage of a series field effect transistor stage. Therefore, the sources and the drains of a field effect transistor stage in the ON state are fixed at a voltage at the L level, and the field effect transistor stage operates with a high forward bias without fail. On the other hand, the sources and the drains of a field effect transistor stage in the OFF state are fixed at a voltage at the H level or a voltage that is gained by subtracting the voltage drop of the diode from the H level voltage, and thereby, the field effect transistor stage operates with a high backward bias without fail.

In the high frequency switching circuit according to the present Embodiment 3, effects are gained where ON/OFF control of field effect transistor stages can be carried out without fail, in addition to the same effects as in Embodiment 2. That is to say, in the ON state, a field effect transistor stage can operate with a forward bias without fail, and in the OFF state, a high backward bias can be applied to a field effect transistor stage without fail. Therefore, a high frequency switching circuit device having excellent properties, such as low insertion loss, high isolation and low distortion, even better than in Embodiment 2, can be implemented.

Embodiment 4

Figure 7:
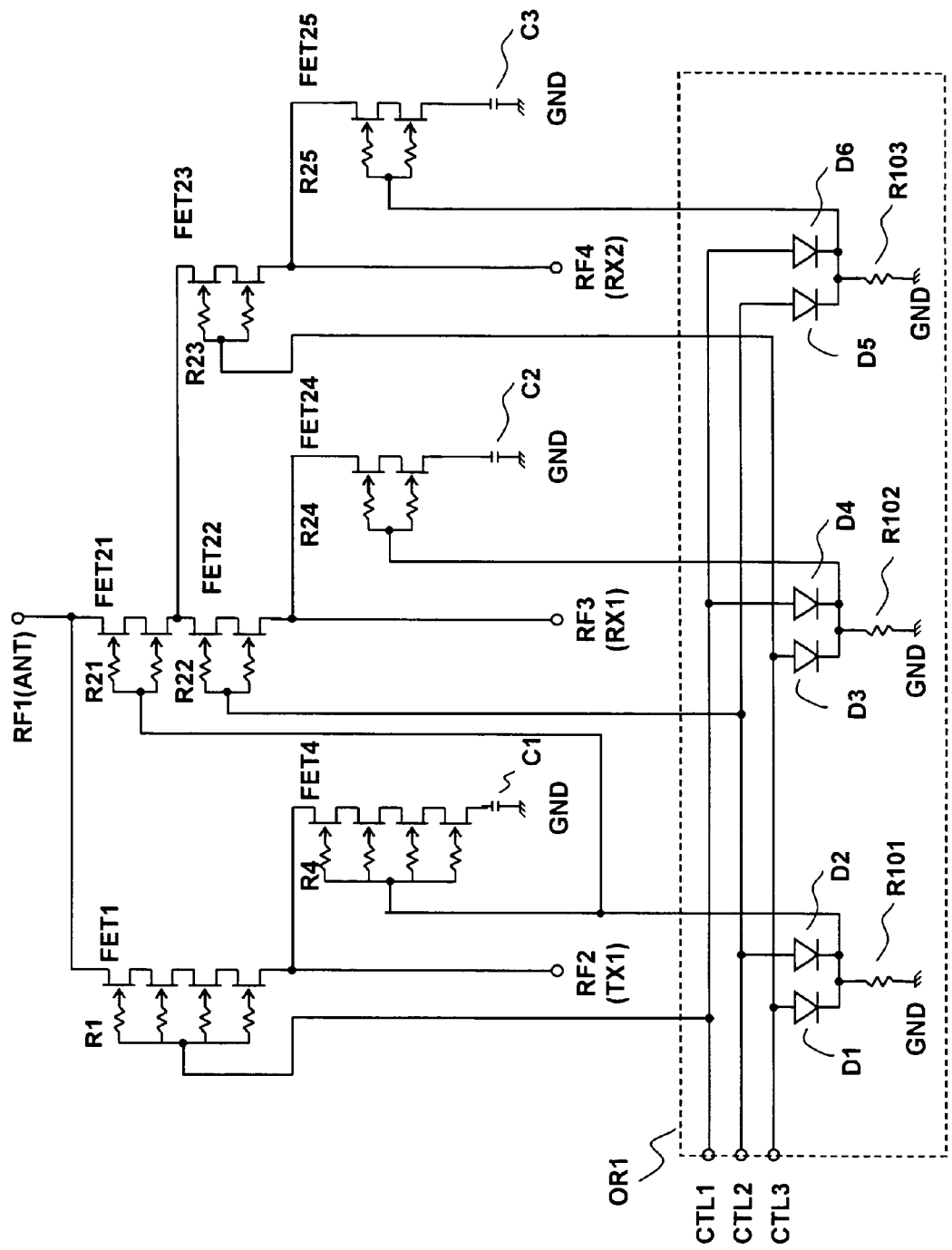
FIG. 7 is a circuit diagram showing the circuit configuration of a high frequency switching circuit device, for example, an SP3T switch, according to the fourth embodiment.

FIG. 7 is a diagram showing an example of a high frequency switching circuit device according to Embodiment 4 of the present invention. Concretely speaking, FIG. 7 shows the circuit configuration of an SP3T switch for high frequency.

The present Embodiment 4 provides a circuit configuration which is effective in communication terminal devices that handle two or more different powers, such as those for switching between transmission to and reception from an antenna. The communication terminal device according to this embodiment uses a semi-microwave band as a communication band.

Figure 8:
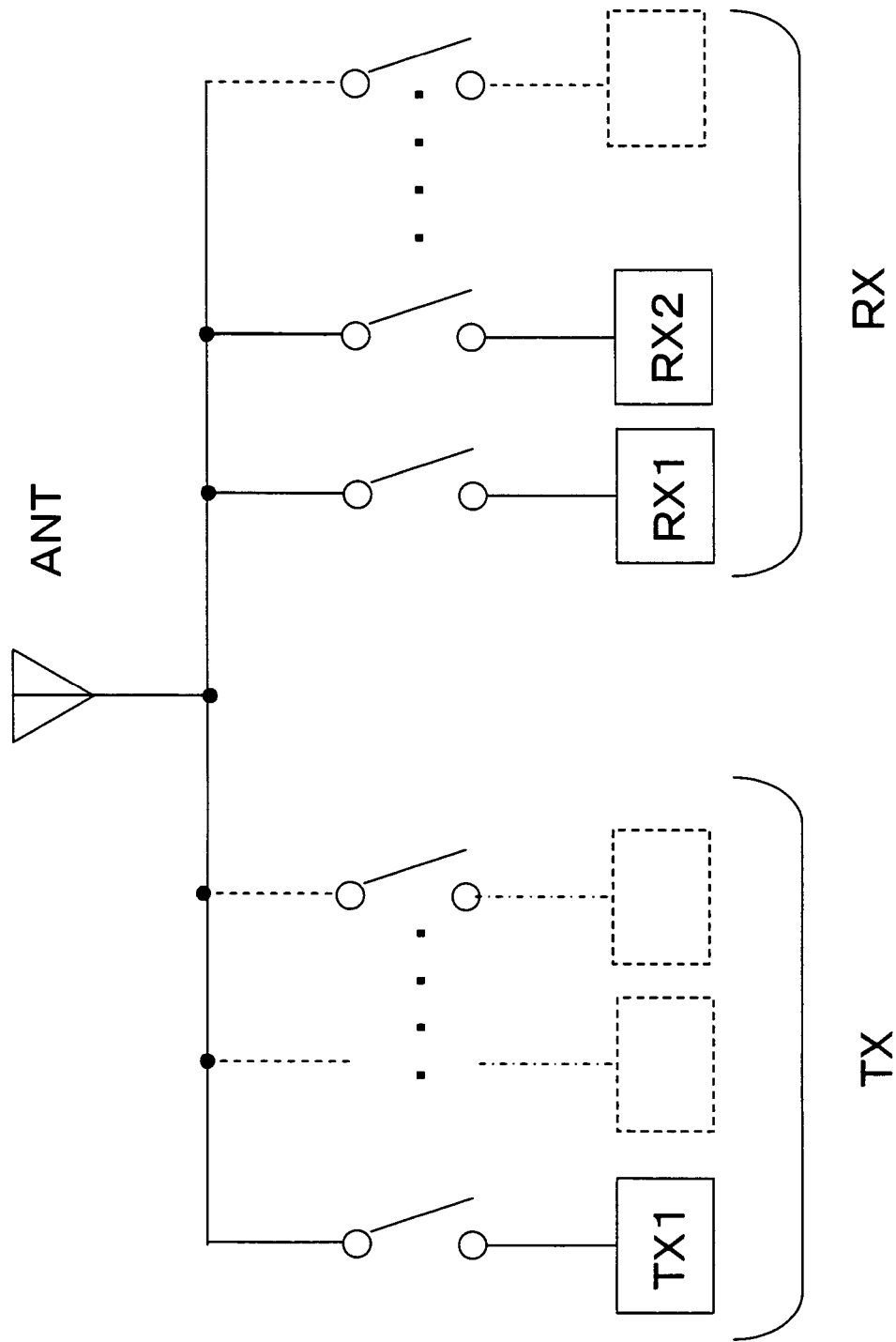
FIG. 8 is a diagram showing an RF signal processing part in the communication terminal device according to the fourth embodiment of the present invention.

FIG. 8 shows an RF signal processing part of a communication terminal using this embodiment. This communication terminal device has a high frequency switching circuit device for switching between at least first high frequency signal, second high frequency signal and third high frequency signal for an antenna ANT. The first high frequency signal is connected to a first transmission circuit TX1 of a transmission part TX, and the second high frequency signal and the third high frequency signal are connected to a first reception circuit RX1 and a second reception circuit RX2 of a reception part RX.

In the case where field effect transistors that form a signal path handle a large power, distortion easily occurs in a field effect transistor stage in the OFF state. Therefore, a number of field effect transistors are connected in series in multiple stages, and thereby, the range of power that can be easily handled is expanded. According to the present embodiment, as shown in the RF signal processing part of the communication terminal of FIG. 8, in the case where paths handle different powers and there are a number of paths on the reception side, some field effect transistor stages from among a number of series field effect transistor stages which perform ON/OFF operation on the paths that handle reception are connected to the terminal on the antenna side as common FET's. As a result, it becomes possible to reduce the size of an antenna switching circuit that has distortion properties at the same level as those according to the prior art.

In the case where, for example, first high frequency signal terminal RF1 of an SP3T switch for high frequency is utilized as antenna connection terminal ANT, second high frequency signal terminal RF2 is utilized as first transmission circuit side terminal TX1, third high frequency signal terminal RF3 is utilized as first reception circuit side terminal RX1, and fourth high frequency signal terminal RF4 is utilized as second reception circuit side terminal RX2, respectively, a circuit configuration to which Embodiment 4 of the present invention has been applied is described below.

In the circuit configuration of FIG. 7, first high frequency signal terminal RF1 to fourth high frequency signal terminal RF4, first field effect transistor stage FET1 and fourth field effect transistor stage FET4, and control voltage input terminals CTL1 to CTL3 are the same as those according to the prior art. First diode D1 to sixth diode D6 are diodes that form diode logic circuit OR1, which is the same as that of Embodiment 1.

The series field effect transistor stage for ON and OFF switching between antenna connection terminal ANT (RF1) and first reception circuit side terminal RX1 (RF3), that is to say, field effect transistor stage FET2 having four stages according to Embodiment 1, is formed of a field effect transistor stage FET21 having two stages and a field effect transistor stage FET22 having two stages. In addition, the shunt field effect transistor stage for securing isolation, that is to say, field effect transistor stage FET5 having four stages according to Embodiment 1, is formed of a field effect transistor stage FET24 having two stages.

The gate terminal voltage of field effect transistor stage FET21 is controlled by the OR voltage of second control voltage input terminal CTL2 and third control voltage input terminal CTL3. In addition, the gate terminal voltage of field effect transistor stage FET22 is controlled by second control voltage input terminal CTL2. Furthermore, the gate terminal voltage of field effect transistor stage FET 24 is controlled by the OR voltage of first control voltage input terminal CTL1 and third control voltage input terminal CTL3.

In addition, in the same manner, the series field effect transistor stage for ON and OFF switching between antenna connection terminal ANT (RF1) and second reception circuit side terminal RX2 (RF4), that is to say, field effect transistor stage FET3 having four stages according to Embodiment 1, is formed of a field effect transistor stage FET21 having two stages and a field effect transistor stage FET23 having two stages. Field effect transistor stage FET21 becomes a field effect transistor stage that is shared by the reception circuit side paths. In addition, the shunt field effect transistor stage for securing isolation, that is to say, field effect transistor stage FET6 having four stages according to Embodiment 1, is formed of field effect transistor stage FET25 having two stages.

The gate terminal voltage of field effect transistor stage FET23 is controlled by third control voltage input terminal CTL3. In addition, the gate terminal voltage of field effect transistor stage FET25 is controlled by the OR voltage of first control voltage input terminal CTL1 and second control voltage input terminal CTL2.

Next, the operation is described. When the path between antenna connection terminal ANT (RF1) and first transmission circuit side terminal TX1 (RF2) is converted to the ON state, a voltage at the H level is supplied to first control voltage input terminal CTL1, and a voltage at the L level is supplied to second control voltage input terminal CTL2 and third control voltage input terminal CTL3. As a result, the control signals that are outputted through diode logic circuit OR1 and the OR voltage of these convert field effect transistor stages FET1, FET24 and FET25 to the ON state, and other field effect transistor stages FET4, FET21, FET22 and FET23 to the OFF state.

At this time, distortion properties are determined by the field effect transistor stages in the OFF state, denoted by symbols FET4, FET21 and FET22, as well as FET21 and FET23, which form OFF paths corresponding to the ON path (between ANT and TX1) and are located between antenna ANT and grounding terminal GND, between antenna ANT and first reception circuit side terminal RX1 (RF3), as well as between antenna ANT and second reception circuit side terminal RX2 (RF4). The OFF paths are formed of four or more stages of field effect transistors in the OFF state. That is to say, when a circuit having the circuit configuration of the present Embodiment 4 is in the transmission state, handling a large power, the same distortion properties can be gained as when all of the field effect transistor stages have four stages.

Next, when the path between antenna connection terminal ANT (RF1) and first reception circuit side terminal RX1 (RF3) is converted to the ON state, a voltage at the H level is supplied to second control voltage input terminal CTL2, and a voltage at the L level is supplied to first control voltage input terminal CTL1 and third control voltage input terminal CTL3. As a result, the control signals which are outputted through diode logic circuit OR1 and the OR voltage of these convert field effect transistor stages FET4, FET21, FET22 and FET25 to the ON state, and other field effect transistor stages FET1, FET23 and FET24 to the OFF state.

At this time, distortion properties are determined by the field effect transistor stages in the OFF state, denoted by symbols FET24, FET1 and FET23, which become the OFF paths corresponding to the ON path (ANT-RX1) and are located between antenna ANT and grounding terminal GND, between antenna ANT and first transmission circuit side terminal TX1 (RF2), as well as between antenna ANT and second reception circuit side terminal RX2 (RF4). The OFF paths are formed of two or more stages of field effect transistors in the OFF state.

In the same manner, when the path between antenna connection terminal ANT (RF1) and second reception circuit side terminal RX2 (RF4) is converted to the ON state, distortion properties are determined by the field effect transistor stages in the OFF state, denoted by symbols FET25, FET1 and FET22, which become the OFF paths corresponding to the ON path (ANT-RX2) and are located between antenna ANT and grounding terminal GND, between antenna ANT and first transmission circuit side terminal TX1 (RF2), as well as between antenna ANT and second reception circuit side terminal RX1 (RF3). The OFF paths are formed of two or more stages of field effect transistors in the OFF state.

That is to say, low power is handled in the state of reception, as compared to the power that is handled in the state of transmission, and therefore, it is possible to reduce the number of stages of field effect transistors, and thus, distortion properties are secured with two stages of field effect transistors in the circuit configuration of the present Embodiment 4.

In the high frequency switching circuit device according to the present Embodiment 4, in the case where paths handle different powers, such as switching between transmission and reception, field effect transistor stages in paths that handle low power, for example, at the time of reception, can be partially shared. Accordingly, it becomes possible to reduce the chip size in comparison with the high frequency switching circuit device according to the prior art. Furthermore, it is possible to control all of the field effect transistor stages with three control systems for controlling series FET's in each path using the same diode logic circuit as that of Embodiment 1, according to the present Embodiment. Therefore, further reduction in the package size can be achieved, in comparison with the high frequency switching circuit having the second configuration according to the prior art, and the high frequency switching circuit according to the present Embodiment 1. Accordingly, the invention can contribute to the miniaturization of cellular phones.

(Other Modifications)

Though the present invention is described on the basis of the above embodiments, the present invention is, of course, not limited to the above described embodiments. The below described cases are also included in the present invention.

(1) Though an SP3T switch having one input and three outputs is cited as an example of a high frequency switching circuit device according to Embodiments 1, 2, 3 and 4, the number of input terminals and output terminals of the high frequency switching circuit device are not limited to this. In addition, the cases where a semiconductor circuit device forms a high frequency switching circuit device having multiple inputs and multiple outputs are, of course, included in the present invention.

Figure 9:
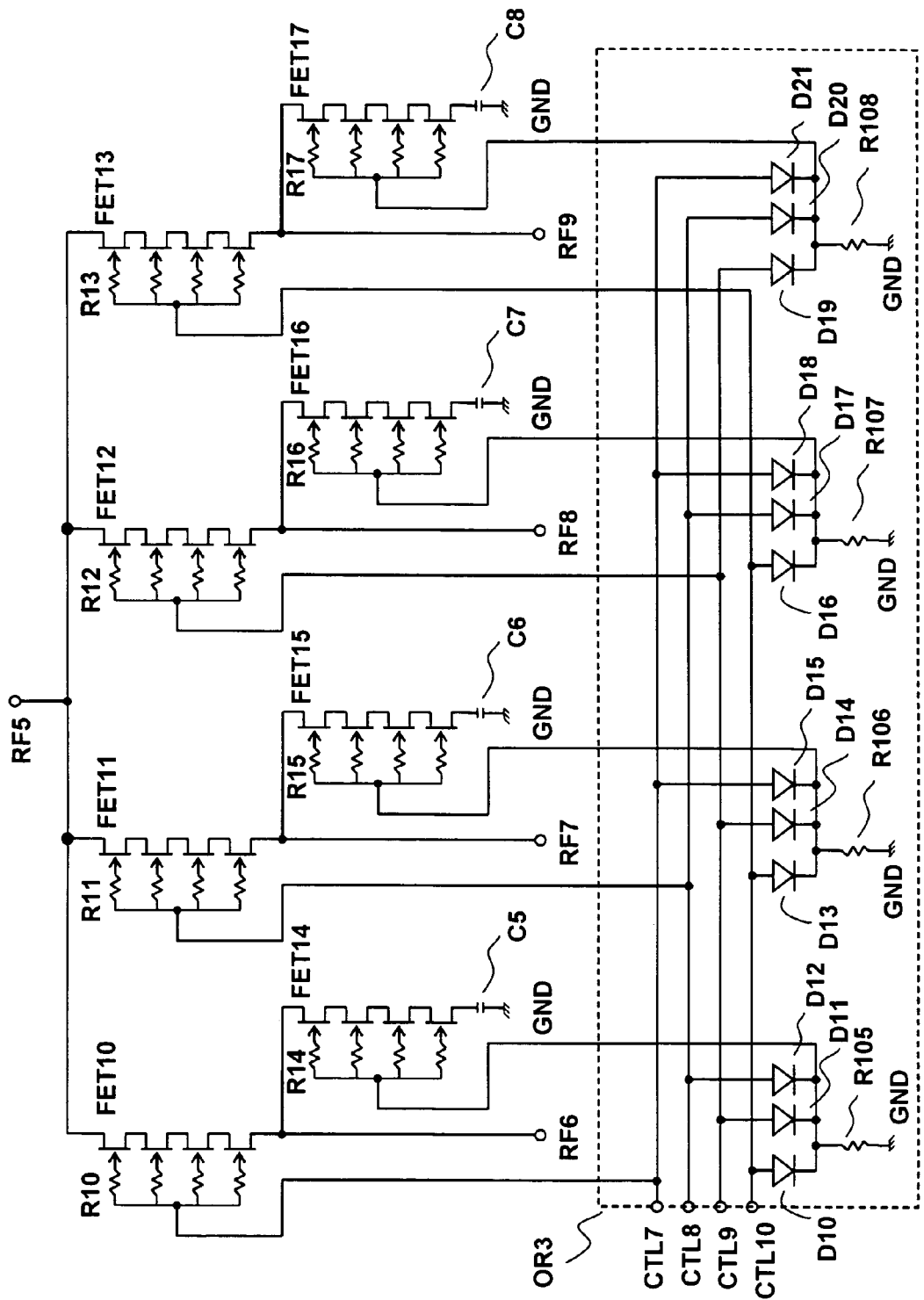
FIG. 9 is a diagram showing the circuit configuration in the case where the configuration according to the first embodiment of the present invention is applied to an SP4T switch circuit device for high frequency.

FIG. 9 shows a circuit configuration diagram in the case where the configuration of Embodiment 1 is applied to an SP4T switch having one input and four outputs. In addition, FIG. 10 shows the control logic table of this diode logic circuit. In FIG. 9, symbols FET10 to FET17 indicate respective field effect transistor stages. Symbols R10 to R17 indicate respective resistors. Symbols RF5 to RF9 indicate respective high frequency signal terminals. Symbols C5 to C8 indicate respective capacitors. Symbol OR3 indicates a diode logic circuit. Symbols D10 to D21 indicate respective diodes. Symbols R105 to R108 indicate respective resistors. Symbols CTL7 to CTL10 indicate respective control voltage input terminals.

(2) Though shunt FET's for securing isolation are connected to all of the paths in the configurations of Embodiments 1, 2, 3 and 4, the number of shunt FET's is not limited to this. That is to say, cases where shunt FET's are not connected to all of the paths and cases where shunt FET's are connected only to particular paths are, of course, included in the present invention.

Figure 11:
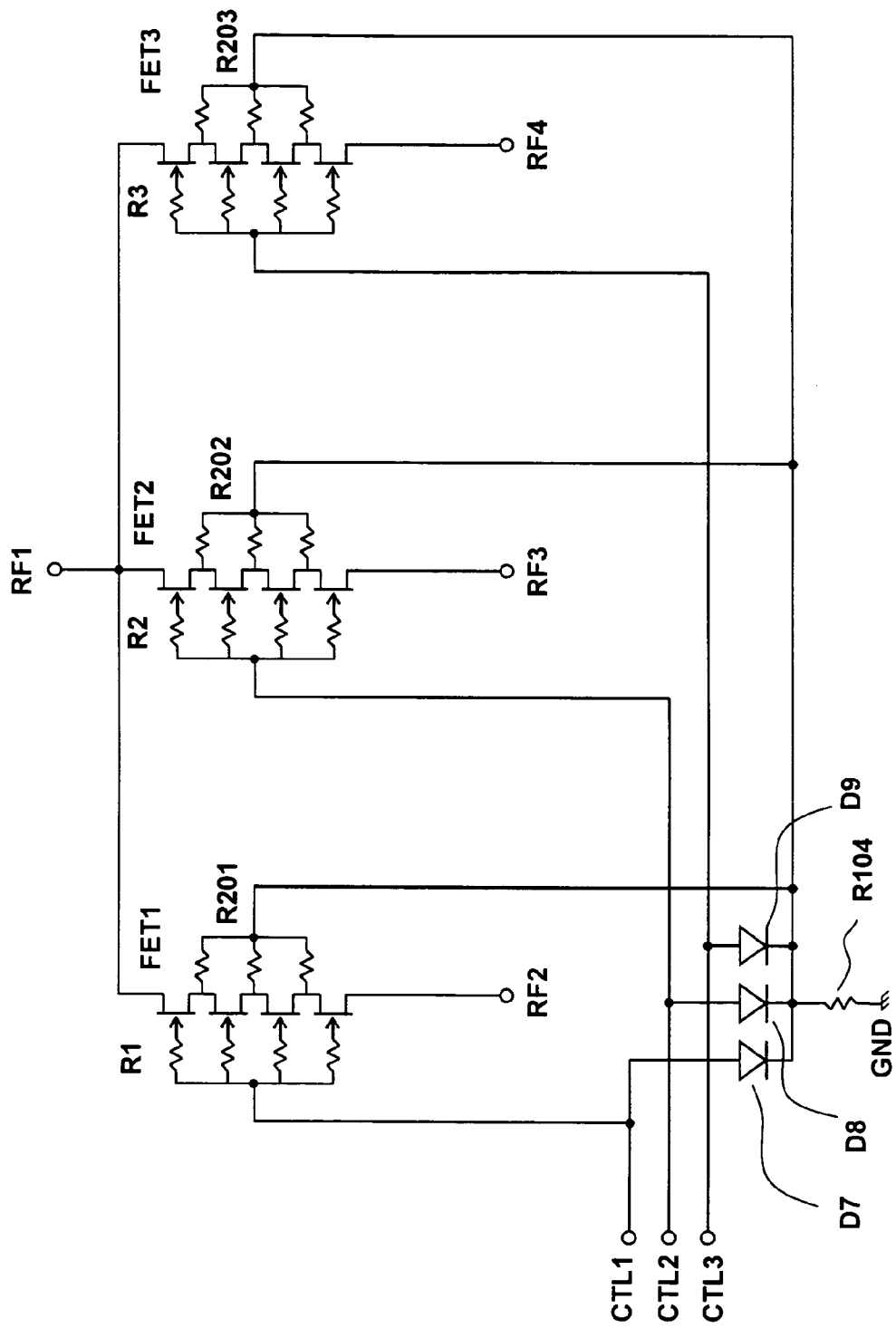
FIG. 11 is a circuit diagram showing the circuit configuration in the case where the configuration according to the second embodiment of the present invention is applied to an SP3T switching circuit device for high frequency without a shunt FET.

FIG. 11 shows the circuit configuration in the case where the configuration of Embodiment 2 is applied to an SP3T switch to which no shunt FET for securing isolation is connected.

Figure 12:
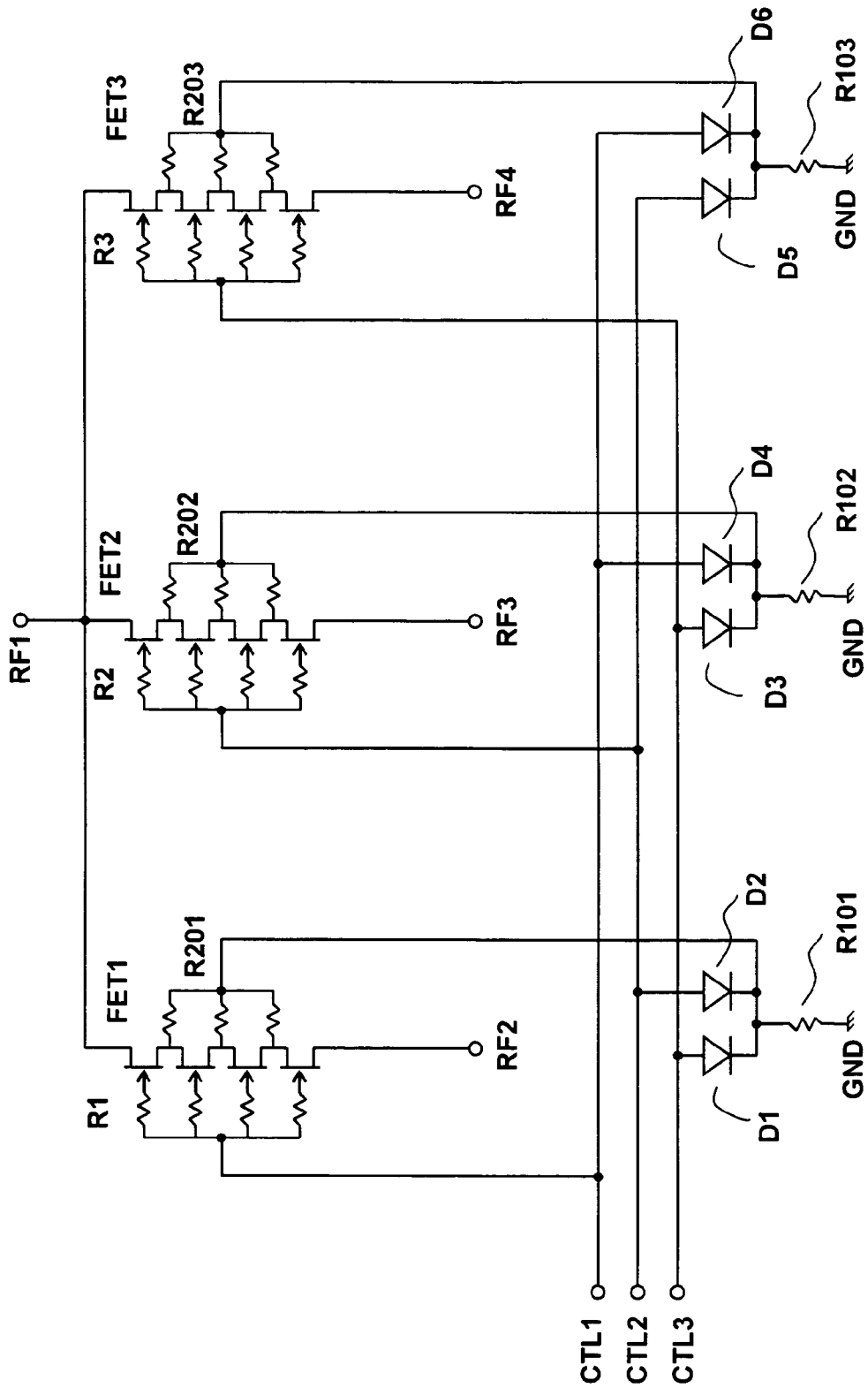
FIG. 12 is a circuit diagram showing the circuit configuration in the case where the configuration according to the third embodiment of the present invention is applied to an SP3T switching circuit device for high frequency without a shunt FET.
Figure 13:
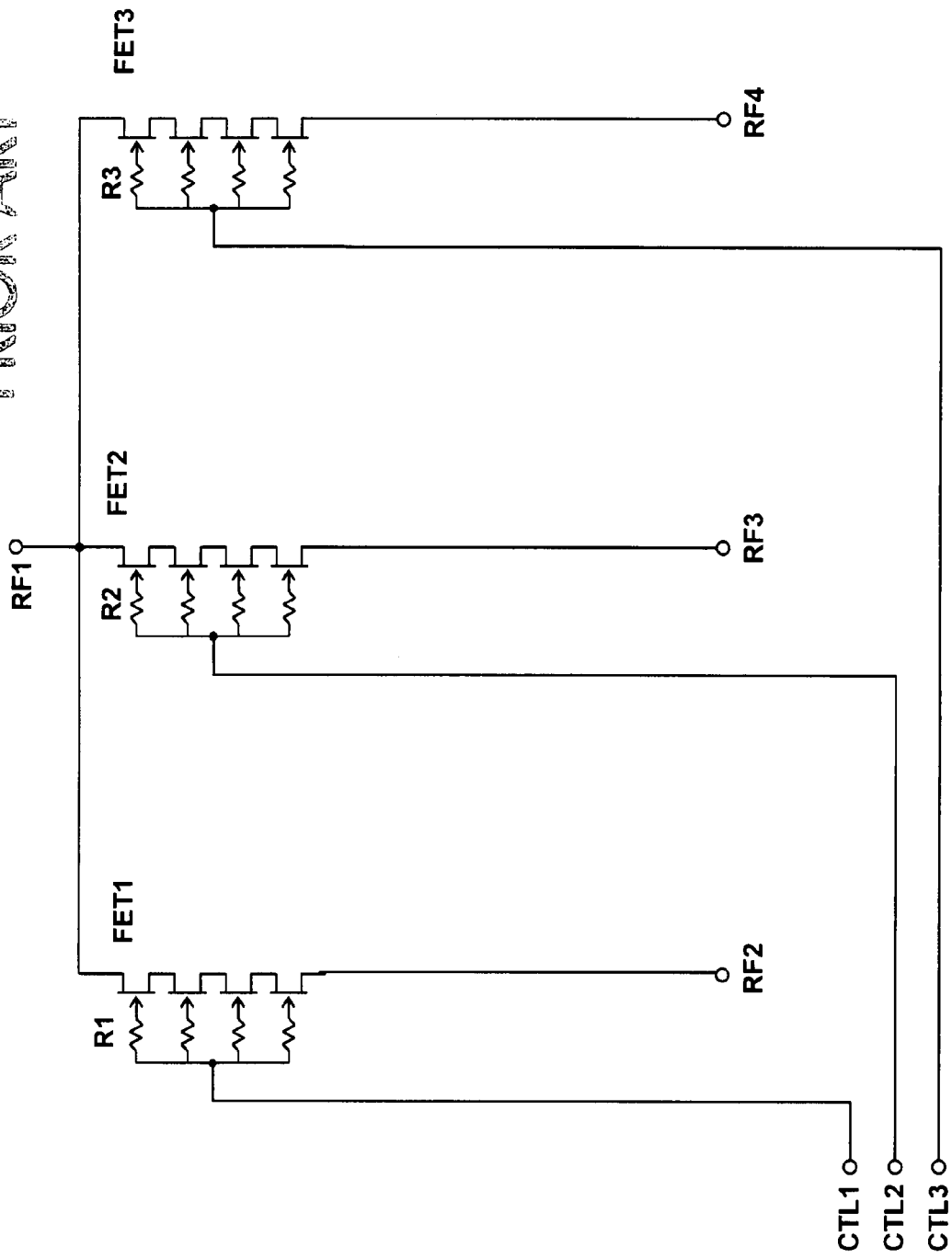
FIG. 13 is a circuit diagram showing the circuit configuration of a first high frequency switching circuit device according to the prior art, for example, an SP3T switch without a shunt FET.

FIG. 12 shows the circuit configuration in the case where the configuration of Embodiment 3 is applied to an SP3T switch to which no shunt FET for securing isolation is connected.

(3) Though the field effect transistor stage, which is a switching circuit provided to each high frequency signal path, is formed of a series circuit of four FET's according to Embodiments 1, 2, 3 and 4, the configuration of the field effect transistor stages is not limited to this. Cases where the field effect transistor stages are formed of one or a number of FET's are included in the present invention.

(4) Though two stages from among the field effect transistor stages on the reception circuit side are shared in Embodiment 4, the configuration of the field effect transistor stages is not limited to this. Cases where one or a number of FET's are shared in a number of field effect transistor stages are included in the present invention.

(5) Though two paths for reception share some field effect transistor stages in the SP3T switch of Embodiment 4, the number of paths that share the same field effect transistor stages is not limited to this. Cases where three or more paths share some field effect transistor stages when an SP4T switch or a high frequency switching circuit device having multiple inputs and multiple outputs is formed are, of course, included in the present invention.

(6) Cases where the above described Embodiments or the above described modifications are implemented in combination are included in the present invention.

INDUSTRIAL APPLICABILITY

A high frequency switching circuit device according to the present invention can be utilized as a device that is formed of a semiconductor circuit, in particular, a high frequency switching device for switching signal paths at the time of transmission and reception of high frequency signals in a range from ultra-short waveband to semi-microwave band in a cellular phone or a portable radio information terminal.

The invention claimed is:

1. A high frequency switching circuit device for allowing at least one of a number of high frequency signal paths to conduct and for cutting off the rest, comprising:
 a compound semiconductor substrate;
 a number of switching elements which are made of metal-semiconductor field effect transistors formed on said compound semiconductor substrate and which interrupt said number of high frequency signal paths respectively;
 a number of control voltage input terminals for individually supplying a number of control voltages to said number of switching elements; and
 a diode logic circuit which is made of a number of diodes that are formed on said compound semiconductor substrate as metal-semiconductor Schottky junctions and which synthesizes logic of said control voltages that are inputted into said number of control voltage input terminals, wherein:
 a logic synthesis voltage that is outputted from said diode logic circuit is supplied to said number of switching elements as another control voltage,
 each of said number of switching elements is formed of a series switching element that has been inserted into each of said number of high frequency signal paths and a shunt switching element that is connected between each of said number of high frequency signal paths and the ground,
 said diode logic circuit outputs the logical sum of at least two control voltages of which the combination differs for each of said number of switching elements as the individual logic synthesis voltage,
 said number of control voltages are individually supplied to the gate electrode of each series switching element of said number of switching elements, and
 said individual logic synthesis voltages that are outputted from said diode logic circuit are supplied to the gate electrode of each shunt switch element of said number of switching elements as said other control voltage, respectively.

2. The high frequency switching circuit device according to claim 1, wherein said individual logic synthesis voltages which are supplied to the gate electrode of a shunt switching element of one switching element from among said number of switching elements are the logical sum of all of the control voltages that are supplied to the remaining switching elements from among said number of switching elements.

3. The high frequency switching circuit device according to claim 1, wherein said series switching element and shunt switch element are respectively formed of a series circuit of a number of metal-semiconductor field effect transistors, said diode logic circuit outputs the logical sum of all of the control voltages that are inputted into said number of control voltage input terminals as a common logic synthesis voltage, and regarding the series switching element and shunt switching element of each of said number of switching elements, said common logical sum voltage that is outputted from said diode logic circuit is supplied to the mutual connection points of said number of metal-semiconductor field effect transistors as said other control voltage.

4. The high frequency switching circuit device according to claim 3, wherein said individual logic synthesis voltages which are supplied to the gate electrode of the shunt switching element of one switching element from among said number of switching elements are the logical sum of all of the control voltages that are supplied to the remaining switching elements from among said number of switching elements.

5. The high frequency switching circuit device according to claim 1, wherein said series switching element and shunt switching element are respectively formed of a series circuit of a number of metal-semiconductor field effect transistors, regarding the respective series switching elements of said number of switching elements, said individual logic synthesis voltages that are outputted from said diode logic circuit are supplied to the mutual connection points of said number of metal-semiconductor field effect transistors as said other control voltage, and regarding the respective shunt switching elements of said number of switching elements, said number of control voltages are respectively supplied to the mutual connection points of said number of metal-semiconductor field effect transistors.

6. The high frequency switching circuit device according to claim 5, wherein said individual logic synthesis voltages that are supplied to the gate electrode of the shunt switching element of one switching element from among said number of switching elements and to the mutual connection points of the metal-semiconductor field effect transistors that form the series switching element are the logical sum of all of the control voltages that are supplied to the remaining switching elements from among said number of switching elements.

7. The high frequency switching circuit device according to claim 5, said individual logic synthesis voltages that are supplied to the mutual connection points of the metal-semiconductor field effect transistors that form the series switching element of one switching element from among said number of switching elements are the logical sum of all of the control voltages that are supplied to the remaining switching elements from among said number of switching elements.

8. A high frequency switching circuit device for allowing at least one of a number of high frequency signal paths to conduct and for cutting off the rest, comprising:
 a compound semiconductor substrate;
 a number of switching elements which are made of metal-semiconductor field effect transistors formed on said compound semiconductor substrate and which interrupt said number of high frequency signal paths respectively;
 a number of control voltage input terminals for individually supplying a number of control voltages to said number of switching elements; and
 a diode logic circuit which is made of a number of diodes that are formed on said compound semiconductor substrate as metal-semiconductor Schottky, junctions and which synthesizes logic of said control voltages that are inputted into said number of control voltage input terminals, wherein:
 a logic synthesis voltage that is outputted from said diode logic circuit is supplied to said number of switching elements as another control voltage,
 each of said number of switching elements is made of a series switching element that is inserted into each of said number of high frequency signal paths,
 said series switching element is formed of a series circuit of a number of metal-semiconductor field effect transistors,
 the series switching elements of some switching elements from among said number of switching elements partially share metal-semiconductor field effect transistors, said diode logic circuit outputs the logical sum of the control voltages that correspond to some switching elements from among said number of switching elements as a logical sum synthesis voltage, regarding some switching elements from said number of switching elements, the control voltages that correspond to some switching elements from among said number of switching elements are individually supplied to the gate electrodes of the metal-semiconductor field effect transistors in the non-shared portion, said logical sum synthesis voltage that is outputted from said diode logic circuit is supplied to the gate electrodes of the metal-semiconductor field effect transistors in the shared portion, and regarding the remaining switching elements from among said number of switching elements, the control voltages that correspond to the remaining switching elements from among said number of switching elements are individually supplied to the gate electrodes of the metal-semiconductor field effect transistors.

9. The high frequency switching circuit device according to claim 8, wherein said diode logic circuit outputs the logical sum of all of the control voltages that are inputted into said number of control voltage input terminals as a common logic synthesis voltage, and regarding the respective series switching elements of said number of switching elements, said common logical synthesis voltage that is outputted from said diode logic circuit is supplied to the mutual connection points of said number of metal-semiconductor field effect transistors as said other control voltage.

10. The high frequency switching circuit device according to claim 8, wherein said number of high frequency signal paths include a received high frequency signal path and a transmitted high frequency signals path, and a switching element that includes a series switching element that partially shares said metal-semiconductor field effect transistors is placed in said received high frequency signal path.

* * * * *